United States Patent
Nogami et al.

(10) Patent No.: US 7,251,799 B2
(45) Date of Patent: Jul. 31, 2007

(54) METAL INTERCONNECT STRUCTURE FOR INTEGRATED CIRCUITS AND A DESIGN RULE THEREFOR

(75) Inventors: Takeshi Nogami, Hopewell Junction, NY (US); Keishi Inoue, Mount Kisco, NY (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 182 days.

(21) Appl. No.: 11/215,766

(22) Filed: Aug. 30, 2005

(65) Prior Publication Data

US 2007/0045850 A1    Mar. 1, 2007

(51) Int. Cl.
G06F 17/50 (2006.01)
(52) U.S. Cl. ............................ 716/10; 716/2; 716/11
(58) Field of Classification Search ............... 716/2, 716/10–11; 257/758, 775, 192; 438/622, 438/638; 365/185.17
See application file for complete search history.

(56) References Cited

U.S. PATENT DOCUMENTS

| | | | | |
|---|---|---|---|---|
| 5,729,491 A * | 3/1998 | Kim et al. | ............. | 365/185.17 |
| 5,790,457 A * | 8/1998 | Kim et al. | ............. | 365/185.17 |
| 6,207,977 B1 * | 3/2001 | Augusto | ............. | 257/192 |
| 6,924,222 B2 | 8/2005 | Goodner et al. | ............. | 438/622 |
| 2001/0033509 A1 | 10/2001 | Ahn et al. | ............. | 365/63 |
| 2002/0064592 A1 | 5/2002 | Datta et al. | ............. | 427/98 |
| 2002/0081381 A1 | 6/2002 | DelaRosa et al. | ....... | 427/255.28 |
| 2003/0082845 A1 | 5/2003 | Hoffman et al. | ............. | 438/106 |
| 2003/0143837 A1 | 7/2003 | Gandikota et al. | .......... | 438/629 |
| 2003/0210103 A1 | 11/2003 | Park et al. | ............. | 333/1 |
| 2003/0218253 A1 | 11/2003 | Avanzino et al. | ............ | 257/758 |
| 2004/0005753 A1 | 1/2004 | Kostamo et al. | ............. | 438/222 |
| 2004/0094402 A1 | 5/2004 | Gopalraja et al. | ...... | 204/192.12 |
| 2004/0099952 A1 | 5/2004 | Goodner et al. | ............. | 257/758 |
| 2004/0102006 A1 | 5/2004 | Xu et al. | ............. | 438/259 |
| 2004/0113222 A1 | 6/2004 | Ozguz et al. | ............. | 257/459 |
| 2004/0130027 A1 | 7/2004 | Chen et al. | ............. | 257/758 |
| 2004/0161922 A1 | 8/2004 | Gallagher et al. | .......... | 438/623 |
| 2004/0185679 A1 | 9/2004 | Ott et al. | ............. | 438/781 |
| 2004/0207091 A1 | 10/2004 | Wang et al. | ............. | 257/758 |
| 2004/0253805 A1 | 12/2004 | Dubin et al. | ............. | 438/618 |
| 2005/0059234 A1 | 3/2005 | Bera et al. | ............. | 438/633 |

(Continued)

*Primary Examiner*—Vuthe Siek
(74) *Attorney, Agent, or Firm*—Mayer & Williams PC; Stuart H. Mayer, Esq.; Karin L. Williams, Esq.

(57) ABSTRACT

A method is provided for designing an integrated circuit having an interconnect structure with a reduced lateral dimension relative to a pre-existing interconnect structure layout. The method begins by reducing in scale by a desired amount the lateral dimension of a given level of metallization in the pre-existing interconnect structure layout by reducing the width of each conductive line in the given level of metallization to a prescribed width. The conductive lines are separated by dielectric material. The given level of metallization in the interconnect structure layout is divided into at least first and second levels of metallization by arranging in the second level of metallization alternating lines from the given level. The prescribed width in the lateral direction of each line is increased in the first and second levels of metallization by a factor of at least two. The layout of lines in the second level of metallization is arranged so that they partially overlap in the vertical direction one of the lines in the first level of metallization.

8 Claims, 6 Drawing Sheets

U.S. PATENT DOCUMENTS

| | | | |
|---|---|---|---|
| 2005/0062034 A1 | 3/2005 | Dubin | 257/20 |
| 2005/0079706 A1 | 4/2005 | Kumar et al. | 438/638 |
| 2005/0088647 A1 | 4/2005 | Shanmugasundram et al. | 356/72 |
| 2005/0093155 A1 | 5/2005 | Kahlert et al. | 257/751 |
| 2005/0110145 A1 | 5/2005 | Elers | 257/758 |
| 2005/0118807 A1 | 6/2005 | Kim et al. | 438/686 |
| 2005/0139948 A1 | 6/2005 | Chung et al. | 257/486 |
| 2005/0142853 A1 | 6/2005 | Tu | 438/624 |
| 2005/0280156 A1* | 12/2005 | Lee | 257/758 |

* cited by examiner

METAL INTERCONNECT STRUCTURE FOR INTEGRATED CIRCUITS AND A DESIGN RULE THEREFOR

FIELD OF THE INVENTION

The present invention generally relates to the fabrication of semiconductor integrated circuits. More specifically, the present invention relates to the arrangement of the metal interconnect structures employed in integrated circuits.

BACKGROUND OF THE INVENTION

Integrated circuits (IC) are manufactured by forming discrete semiconductor devices on a surface of a semiconductor substrate, such as a silicon wafer. A multi-level network of interconnect structures is then formed to interconnect the devices. Copper is the material of choice for interconnect structures of advanced IC devices having high circuit density. In addition to superior electrical conductivity, copper is more resistant than aluminum to electromigration, a phenomenon that may destroy a thin film conductive line during IC operation.

An IC device comprises a plurality of interconnect structures that are separated from each other and the substrate by the ILD layers. Such structures are generally fabricated using a dual damascene technique that comprises forming an insulator layer (e.g., ILD layer) into which trenches and openings are etched to pattern the conductive lines and contact holes, or vias. The copper is then used to fill (metallize) the trenches and openings in the IMD layer forming the conductive lines and vias, respectively. During the copper metallization process, an excess amount of copper may be deposited onto the substrate. The excess metal may be removed using a planarization process, e.g., chemical-mechanical polishing (CMP) process. After the planarization process, the interconnect structure is embedded in the ILD layer coplanar with an exposed surface of the layer, such that the next wiring layer may be formed on top of the embedded ILD layer.

In the semiconductor industry, much effort is spent in developing smaller IC devices with ever-increasing operating speeds. To increase the circuit density, a dual damascene technique may be used during fabrication of the IC devices. To increase the operating speed of such a device, the ILD layers are formed using materials having dielectric constants less than about 4.0. Such materials are generally referred to as low-k materials. The low-k materials generally comprise carbon-doped dielectrics, such as organic doped silicon glass (OSG), fluorine doped silicon glass (FSG), organic polymers, and the like.

While performance of the active elements in an IC device generally increases as the size of the IC device decreases, this is not the case for the interconnect structures because the resistance and capacitance of the conductive lines increase as the device size decreases. This relationship between interconnect size and performance is sometimes referred to as the Reverse-Scaling Rule (RSR). Because of RSR, the increase in resistance and capacitance of the conductive lines is becoming a dominant factor in determining circuit performance. As a result, continued reductions in IC device size do not simply lead to improved circuit performance, but may lead to worse performance.

The reverse-scaling rule can be particularly problematic when a new generation of an existing IC device is being developed. The most straightforward way to reduce an existing IC device in size is to simply reduce all the lateral dimensions of the various elements with respect to the previous generation. Because of the reverse-scaling rule, however, this cannot be done for the interconnect structure without sacrificing performance.

Accordingly, it would be desirable to provide a procedure for using the same interconnect architecture used in the previous generation and adapting it for a new, smaller generation of IC devices to thereby avoid the need for designing an entirely new interconnect architecture.

SUMMARY OF THE INVENTION

In accordance with the present invention, a method is provided for designing an integrated circuit having an interconnect structure with a reduced lateral dimension relative to a pre-existing interconnect structure layout. The method begins by reducing in scale by a desired amount the lateral dimension of a given level of metallization in the pre-existing interconnect structure layout by reducing the width of each conductive line in the given level of metallization to a prescribed width. The conductive lines are separated by dielectric material. The given level of metallization in the interconnect structure layout is divided into at least first and second levels of metallization by arranging in the second level of metallization alternating lines from the given level. The prescribed width in the lateral direction of each line is increased in the first and second levels of metallization by a factor of at least two. The layout of lines in the second level of metallization is arranged so that they partially overlap in the vertical direction one of the lines in the first level of metallization.

In accordance with one aspect of the invention, at least a subset of the lines in the given level of metallization each have conductive vias vertically extending therefrom.

In accordance with another aspect of the invention, a subset of lines in the second level of metallization have a recess for preventing an electrical short with one of the vertically extending vias that is adjacent thereto.

In accordance with another aspect of the invention, an integrated circuit is formed in accordance with the reduced lateral dimension design set forth above.

DETAILED DESCRIPTION

The methods and structures described herein do not form a complete process for manufacturing semiconductor device structures. The remainder of the process is known to those of ordinary skill in the art and, therefore, only the process steps and structures necessary to understand the present invention are described herein.

The present invention can be applied to microelectronic devices, such as highly integrated circuit semiconductor devices, processors, micro electromechanical (MEM) devices, optoelectronic devices, and display devices. In particular, the present invention is highly useful for devices requiring high-speed characteristics, such as central processing units (CPUs), digital signal processors (DSPs), combinations of a CPU and a DSP, application specific integrated circuits (ASICs), logic devices, and SRAMs.

As used herein the term "vertical" refers to the direction perpendicular to the plane of the IC substrate, regardless of the orientation of the substrate. Likewise, the terms "above" and "below" refer to relative locations in the vertical direction that are more remote from, or closer to, the substrate, respectively.

Figure 1:
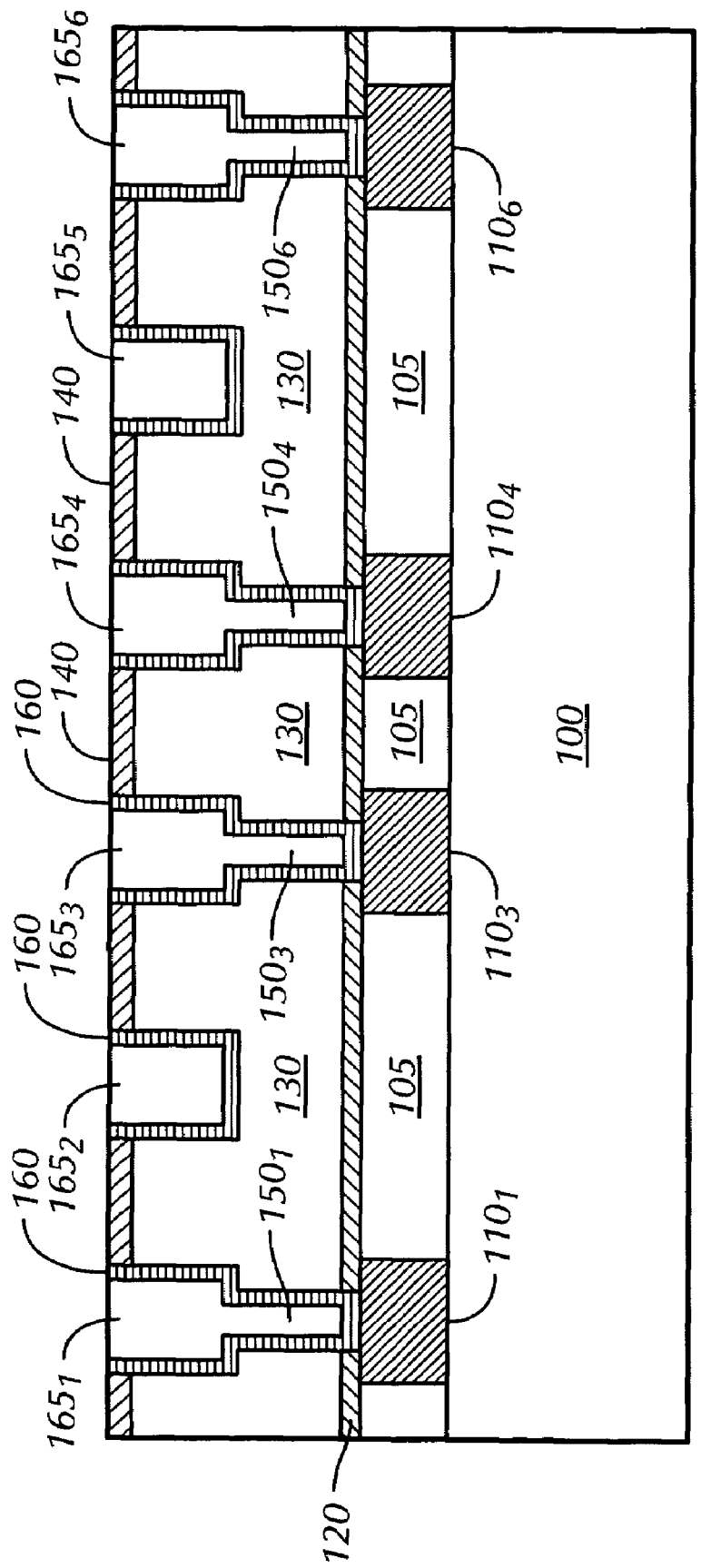
FIG. 1 shows a cross-sectional view of an IC device having an interconnect structure in which the conductive lines are formed in trenches by a dual damascene process.

FIG. 1 shows a cross-sectional view of an IC device having an interconnect structure in which the conductive lines are formed in trenches by a dual damascene process. The IC device is formed on a substrate 100. A lower ILD 105, including lower interconnections 110, is formed on the substrate 100. Various active devices and passive devices may be formed on the substrate 100. The lower interconnection 110 may be formed of various interconnection materials, such as copper, copper alloy, aluminum, and aluminum alloy. The lower interconnection 110 is preferably formed of copper because of its low resistance.

The interconnect structure includes a series of parallel conductive lines 165 (lines $165_1$-$165_6$) that are electrically isolated from one another by ILD 130. Vias 150 electrically connect the lines 165 to the lower interconnections 110. In the particular cross-section shown in FIG. 1, lines $165_1$, $165_3$, $165_4$, and $165_6$ are respectively connected to lower interconnection $110_1$, $110_3$, $110_4$, and $110_6$ by vias $150_1$, $150_3$, $150_4$, and $150_6$, respectively.

When a new generation of an existing IC device is being developed, the simplest way to reduce it in size is to simply reduce all the lateral dimensions of the various elements with respect to the previous generation. Because of the reverse-scaling rule, however, this cannot be done for the interconnect structure without sacrificing performance. The present invention provides a procedure for using the same interconnect architecture used in the previous generation and adapting it for a new, smaller generation of IC devices. In this way the need for designing an entirely new interconnect architecture can be avoided.

In accordance with the present invention, a single metal level in the interconnect structure, such as the metal level formed by lines $165_1$-$165_6$ in FIG. 1, is divided into two or more separate metal levels. Then, if the level is divided into two levels, for instance, the width of each line is selected to be twice what the width would otherwise be after all the lateral dimensions of the various elements have been reduced by the desired amount.

Figure 2:
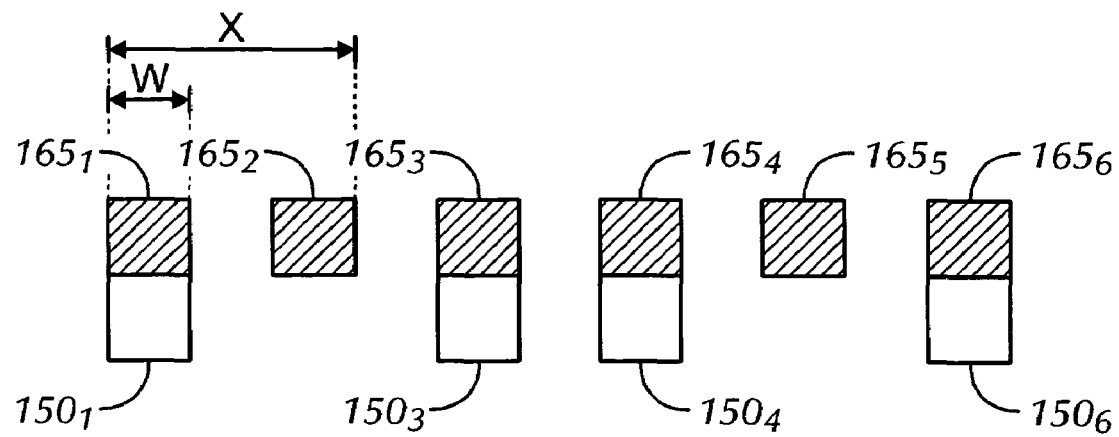
FIG. 2 shows the conductive lines and vias from the interconnect structure of FIG. 1 without the remaining features of the IC device.

For clarity in understanding the principles of the present invention, FIG. 2 shows the conductive lines 165 and vias 150 from the interconnect structure of FIG. 1 without the remaining features of the IC device. The dimensions of the lines 165 in FIG. 2 are assumed to have been already reduced from those in FIG. 1, along with the lateral dimensions of the other elements in the IC device. That is, the lines 165 in FIG. 2 each have a width W that is less than their original width in the previous generation IC device of FIG. 1.

Figure 3:
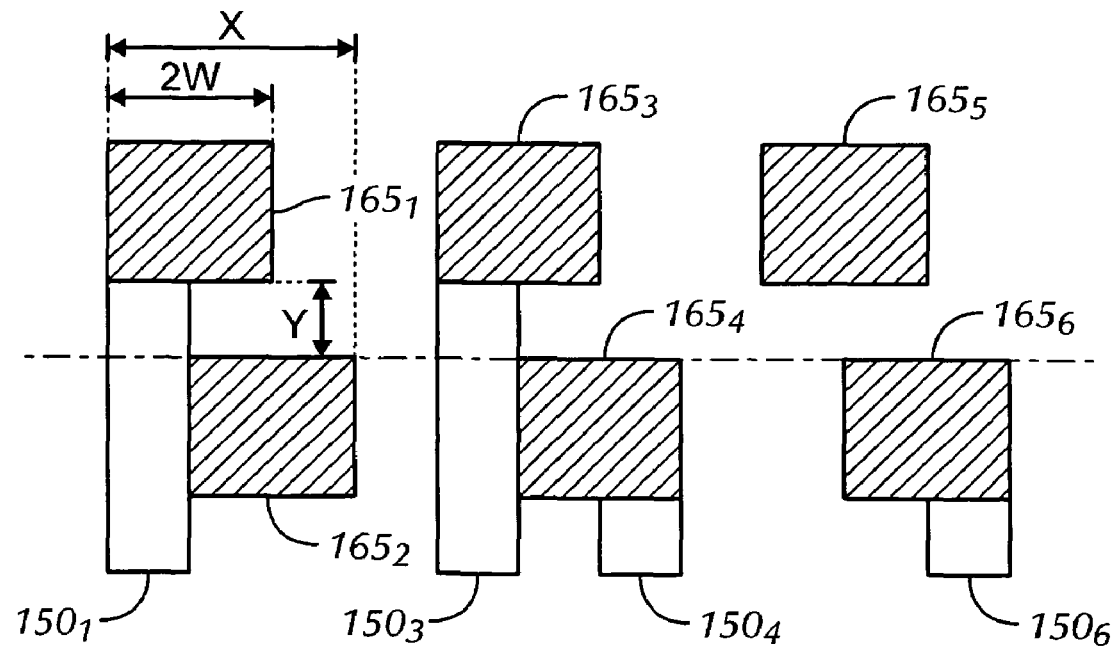
FIG. 3 shows the architecture of the conductive lines after they have been rearranged into two levels in accordance with one embodiment of the present invention.

FIG. 3 shows the architecture of the lines 165 after they have been rearranged into two levels in accordance with the present invention. As shown, each line now has a width of 2 W. Since the width of the individual lines has been increased, degradations in performance arising from the reverse-scaling rule have been reduced. However, this increase in width has not been at the expense of any overall increase in the lateral dimension of the interconnect structure. That is, as FIG. 3 shows, the total width X occupied by any two adjacent lines in FIG. 2 is the same as the total width occupied by any two adjacent lines shown in FIG. 3. This is accomplished by staggering the lines in each level so that each line in the lower level (lines $165_2$, $165_4$, $165_6$) is situated in part below one of the lines in the upper level (lines $165_1$, $165_3$, $165_5$). In the embodiment of the invention depicted in FIG. 2 in which one metal level has been divided into two levels of metal, half of each line in the lower level is situated below one of the lines in the upper level. In this way two adjacent lines on different levels (e.g., lines $165_1$ and $165_2$) only occupy as much space in the lateral direction as the same two lines in FIG. 2. Put another way, the width of the lines in FIG. 3 have been increased over that in FIG. 2 at the expense of an increase in the vertical dimension they occupy instead of an increase in the lateral dimension they occupy.

One problem that can arise when a level of metal is divided into two or more levels as depicted in FIG. 3 is that an electrical short may occur whenever a line on the lower level contacts a via of an adjacent line of the upper level. For instance, in FIG. 3 a short may arise between line $165_2$ and via $150_1$ as well as between line $165_4$ and via $150_3$. As detailed below, this problem can be overcome by reshaping those lines on the lower level that would otherwise give rise to an electrical fault so that they do not contact the adjacent via.

Figure 4A:
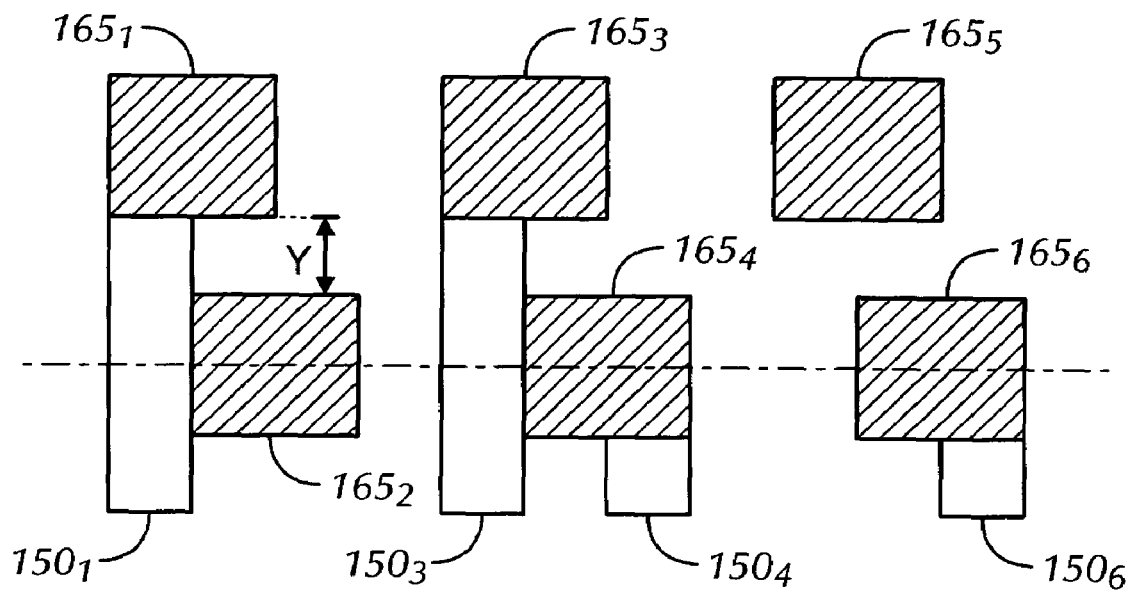
FIG. 4(a) shows a cross-sectional view taken along line I-I in FIG. 4(b) and FIG. 4(b) shows a plan view of one embodiment of the interconnect structure constructed in accordance with the present invention.
Figure 4B:
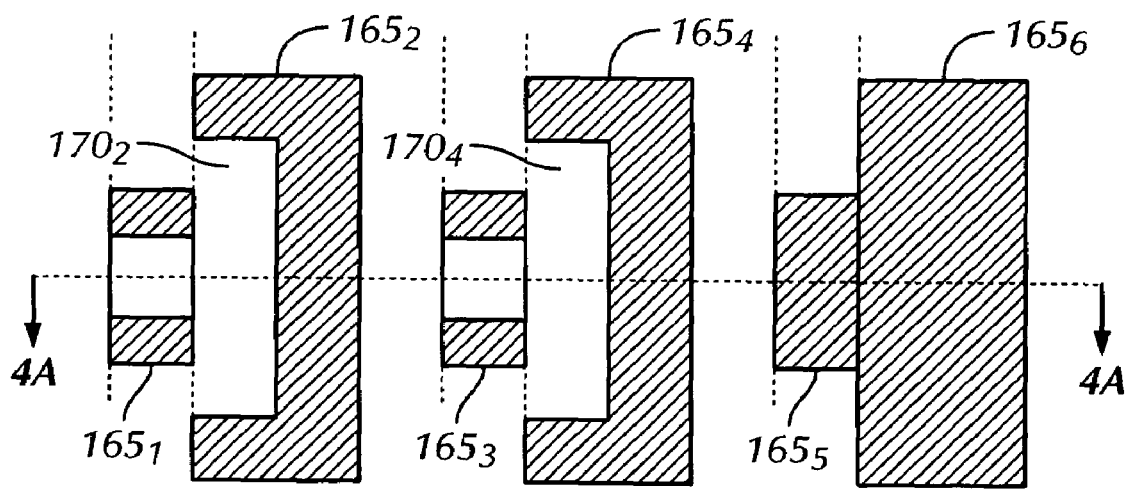

FIG. 4(a) shows the same cross sectional view of the two levels of metal that is depicted in FIG. 3. FIG. 4(b) shows a plan view corresponding to the cross-sectional view of FIG. 4(a). That is, FIG. 4(a) is a cross-sectional view taken along line I-I in FIG. 4(b). As shown in the plan view of FIG. 4(b), a vertically extending recess is provided in the portion of the line in the lower level that vertically overlaps with a line in the upper level from which a via extends. That is, lines 1652 and 1654 have recesses 1702 and 1704, respectively. Recesses $170_2$ and $170_4$ are filled with a dielectric. While recesses $170_2$ and $170_4$ are shown in FIG. 4(b) as having a rectangular configuration in the plane of the substrate, the recesses more generally may have any shape desired so long as the line is which the recess is provided is electrically isolated from its adjacent via. The recesses may be formed during the lithographic process used to pattern the lines. That is, an appropriate mask is used so that when the trenches in which the lines are formed are etched, the trenches will have the desired configuration.

The vertical separation Y (see FIG. 4(a)) between the two levels of metallization should preferably be chosen to reduce or prevent crosstalk between the vertically overlapping lines.

FIGS. 5-13 show an exemplary process for forming the conductive lines in accordance with the present invention. For simplicity, only a single line and via are illustrated. Of course, the same process may be used to form a series of parallel lines and vias such as depicted in FIGS. 1-4. It should be noted that this process is presented by way of illustration only and not as a limitation on the invention. More generally, the present invention encompasses any process for forming an interconnect structure in an IC device and is not limited, for example, to the dual damascene technique presented below. In FIGS. 1-13 like reference numerals are used to denote like elements.

Figure 5:
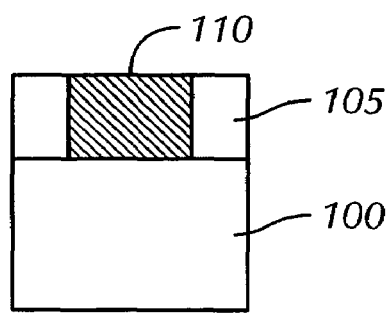
FIGS. 5-13 show cross-sectional views illustrating the formation of a dual damascene structure constructed in accordance with the present invention.

As shown in FIG. 5, substrate 100 is prepared. The lower ILD 105 including a lower interconnection 110 is formed on the substrate 100. The substrate 100 may be, for example, a silicon substrate, a silicon on insulator (SOI) substrate, a gallium arsenic substrate, a silicon germanium substrate, a ceramic substrate, a quartz substrate, or a glass substrate for display. As previously noted, various active devices and passive devices may be formed on the substrate 100. The lower interconnection 110 may be formed of various interconnection materials, such as copper, copper alloy, aluminum, and aluminum alloy. The lower interconnection 110 is preferably formed of copper because of its low resistance. Also, the surface of the lower interconnection 110 is preferably planarized.

Figure 6:
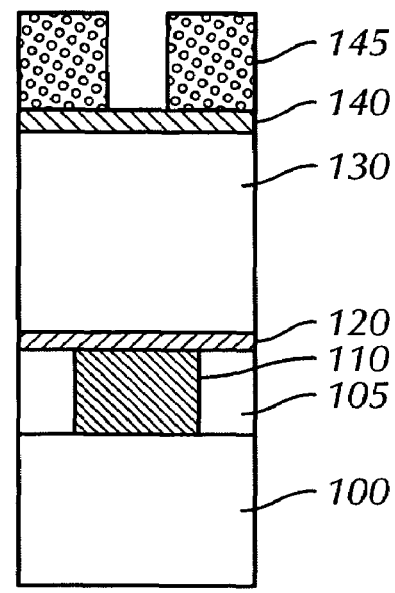

Referring to FIG. 6, an etch stop layer 120, the low-k ILD 130, and a capping layer 140 are sequentially stacked on the surface of the substrate 100 where the lower interconnection 110 is formed, and a photoresist pattern 145 is formed on the capping layer 140 to define a via.

The etch stop layer 120 is formed to prevent electrical properties of the lower interconnection 110 from being damaged during a subsequent etch process for forming a via. Accordingly, the etch stop layer 120 is formed of a material having a high etch selectivity with respect to the ILD 130 formed thereon. Preferably, the etch stop layer 120 is formed of SiC, SiN, or SiCN, having a dielectric constant of 4 to 5. The etch stop layer 120 is as thin as possible in consideration of the dielectric constant of the entire ILD, but thick enough to properly function as an etch stop layer.

The ILD 130 may be formed of a hybrid low-k dielectric material, which has advantages of organic and inorganic materials. That is, the ILD 130 can be formed of a hybrid low-k dielectric material having low-k characteristics, which can be formed using a conventional apparatus and process, and which is thermally stable. The ILD 130 has a dielectric constant of e.g., 3.5 or less, to prevent an RC delay between the lower interconnection 110 and dual damascene interconnections and minimize cross talk and power consumption. For example, the ILD 130 may be formed of low-k organosilicon material such as Black Diamond™, Silk™, CORAL™, or a similar material. The ILD 130 can be formed using chemical vapor deposition (CVD), and more specifically, plasma-enhanced CVD (PECVD). The ILD 130 may be also formed from low k materials such as spin-on organics and organo silicates. The ELD 130 is formed to a thickness of about 3,000 angstroms to 20,000 angstroms or other appropriate thicknesses determined by those skilled in the art.

The capping layer 140 prevents the ILD 130 from being damaged when dual damascene interconnections are planarized using chemical mechanical polishing (CMP). Thus, the capping layer 140 may be formed of $SiO_2$, SiOF, SiON, SiC, SiN, or SiCN. The capping layer 140 may also function as an anti-reflection layer (ARL) in a subsequent photolithographic process for forming a trench. In this case the capping layer 140 is more preferably formed of $SiO_2$, SiON, SiC, or SiCN.

Figure 7:
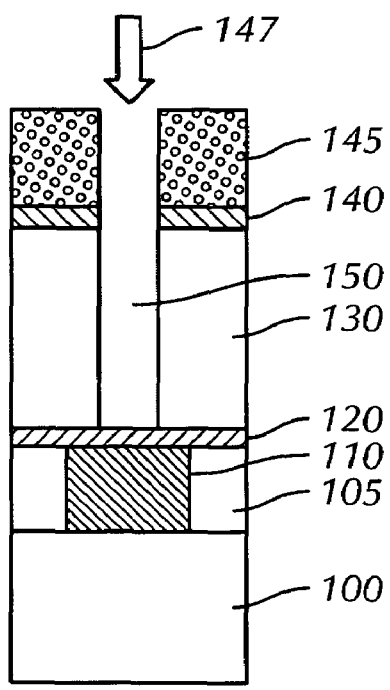

The via photoresist pattern 145 is formed by forming a layer of a photoresist and then performing exposure and developing processes using a photo mask defining a via. Referring to FIG. 7, the ILD 130 is anisotropically etched (147) using the photoresist pattern 145 as an etch mask to form a via 150. The ILD 130 can be etched, for example, using a reactive ion beam etch (RIE) process, which uses a mixture of a main etch gas (e.g., $C_xF_y$ and $C_xH_yF_z$), an inert gas (e.g. Ar gas), and possibly at least one of $O_2$, $N_2$, and $CO_x$. Here, the RIE conditions are adjusted such that only the ILD 130 is selectively etched and the etch stop layer 120 is not etched.

Figure 8:
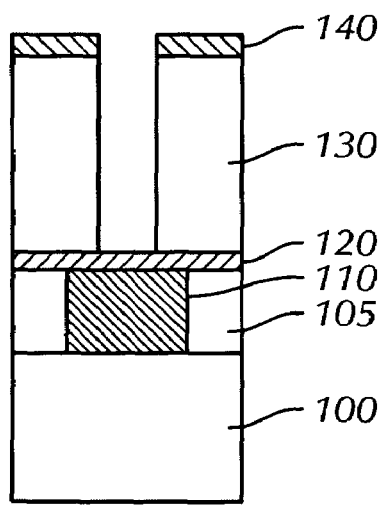
Figure 9:
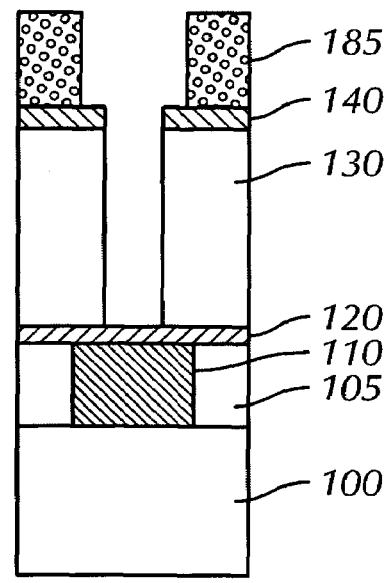
Figure 10:
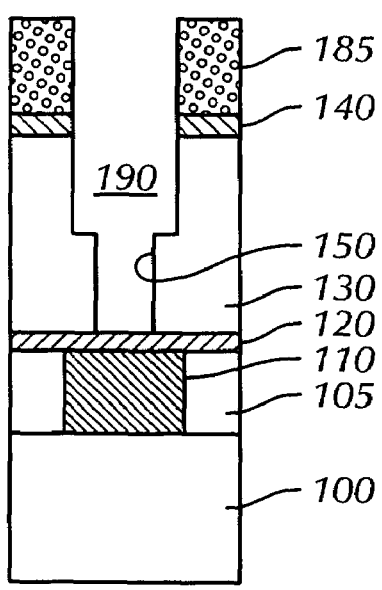
Figure 11:
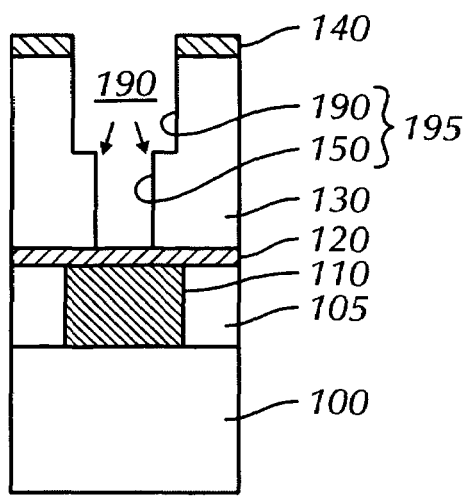

Referring to FIG. 8, the via photoresist pattern 145 is removed using a plasma etch, for example. Next, referring to FIG. 9, a trench photoresist pattern 185 is formed, followed by formation of a trench 190 in FIG. 10. The capping layer 140 is etched using the photoresist pattern 185 as an etch mask, and then the ILD 130 is etched to a predetermined depth to form the trench 190. If required, the trench photoresist pattern 185 defines the recess 170 of the trench depicted in FIG. 4(b). The resulting structure, shown in FIG. 11, defines a dual damascene interconnection region 195, which includes the via 150 and the trench 190.

Figure 12:
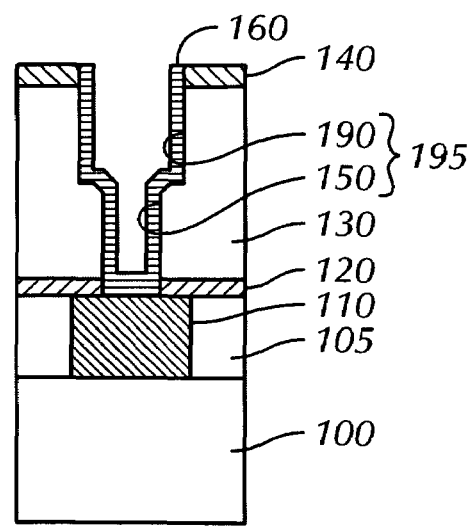

Referring to FIG. 12, the etch stop layer 120 exposed in the via 150 is etched until the lower interconnection 110 is exposed, thereby completing the dual damascene interconnection region 195. The etch stop layer 120 is etched so that the lower interconnection 110 is not affected and only the etch stop layer 120 is selectively removed.

Figure 13:
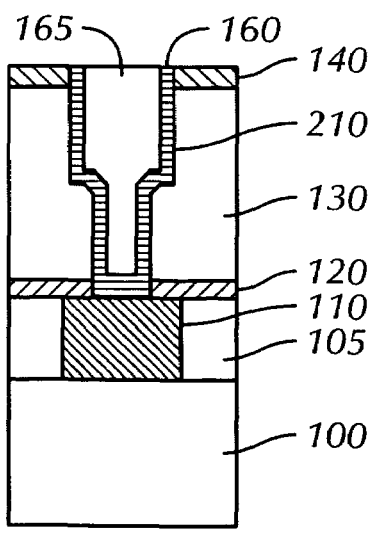

A barrier layer 160 is formed on the dual damascene interconnection region 195 to prevent the subsequently formed conductive layer from diffusing into ILD 130. The barrier layer 160 is generally formed from a conventional material such as tantalum, tantalum nitride, titanium, titanium silicide or zirconium. After formation of the barrier layer 160 the copper conductive layer is formed on the barrier layer by an electroplating process. Referring to FIG.13, the bulk copper layer 165 is formed on the dual damascene interconnection region 195 by electroplating and then planarized, thereby forming a dual damascene interconnection 210 having conductive line 165.

The aforementioned process depicted in FIGS. 5-13 illustrates the formation of one level of metallization defined by conductive line 165. The additional levels of metallization that are required by the present invention may be formed in a similar manner.

The invention claimed is:

1. A method for designing an integrated circuit having an interconnect structure with a reduced lateral dimension relative to a pre-existing interconnect structure layout, comprising:

reducing in scale by a desired amount the lateral dimension of a given level of metallization in the pre-existing interconnect structure layout by reducing the width of each conductive line in the given level of metallization to a prescribed width, said conductive lines being separated by dielectric material;

dividing the given level of metallization in the interconnect structure layout into at least first and second levels of metallization by arranging in the second level of metallization alternating lines from the given level;

increasing the prescribed width in the lateral direction of each line in the first and second levels of metallization by a factor of at least two; and arranging the layout of lines in the second level of metallization so that they partially overlap in the vertical direction one of the lines in the first level of metallization.

2. The method of claim 1 wherein at least a subset of the lines in the given level of metallization each have conductive vias vertically extending therefrom.

3. The method of claim 2 wherein a subset of lines in the second level of metallization have a recess for preventing an electrical short with one of the vertically extending vias that is adjacent thereto.

4. The method of claim 1 wherein said interconnect structure is a dual damascene structure.

5. An integrated circuit formed in accordance with the reduced lateral dimension design set forth in claim 1.

6. The integrated circuit of claim 5 wherein said interconnect structure is a dual damascene structure.

7. The integrated circuit of claim 5 wherein at least a subset of the lines in the given level of metallization each have conductive vias vertically extending therefrom.

8. The integrated circuit of claim 7 wherein a subset of lines in the second level of metallization have a recess for preventing an electrical short with one of the vertically extending vias that is adjacent thereto.

* * * * *

UNITED STATES PATENT AND TRADEMARK OFFICE
CERTIFICATE OF CORRECTION

PATENT NO. : 7,251,799 B2
APPLICATION NO. : 11/215766
DATED : July 31, 2007
INVENTOR(S) : Takeshi Nogami et al.

It is certified that error appears in the above-identified patent and that said Letters Patent is hereby corrected as shown below:

Specification, Col. 1, Line 64, after "the", change "reverse-scaling rule" to --(RSR)--.

Specification, Col. 2, Line 2, after "the", change "reverse-scaling rule" to --(RSR)--.

Specification, Col. 2, Line 17, after "scale", insert --,--.

Specification, Col. 2, Line 17, after "amount", insert --,--.

Specification, Col. 2, Line 36, after "metallization", change "have" to --has--.

Specification, Col. 3, Line 41, change "reverse-scaling rule" to --(RSR)--.

Specification, Col. 4, Line 4, change "reverse-scaling rule" to --(RSR)--.

Specification, Col. 4, Line 17, after "way", insert --,--.

Specification, Col. 4, Line 28, after "3", insert --,--.

Specification, Col. 4, Line 29, after "$150_1$", insert --,--.

Specification, Col. 4, Line 43, after "lines", change "1652" to --$165_2$--.

Specification, Col. 4, Line 43, before "have", change "1654" to --$165_4$--.

Specification, Col. 4, Line 43, after "recesses", change "1702" to --$170_2$--.

Specification, Col. 4, Line 43, before "respectively", change "1704" to --$170_4$--.

Specification, Col. 5, Line 47, after "the", change "ELD" to --ILD--.

UNITED STATES PATENT AND TRADEMARK OFFICE
CERTIFICATE OF CORRECTION

PATENT NO. : 7,251,799 B2
APPLICATION NO. : 11/215766
DATED : July 31, 2007
INVENTOR(S) : Takeshi Nogami et al.

It is certified that error appears in the above-identified patent and that said Letters Patent is hereby corrected as shown below:

Specification, Col. 6, Line 28, after "160", insert --,--.

Specification, Col. 6, Line 30, change "FIG.13" to --FIG. 13--.

Signed and Sealed this

Second Day of December, 2008

JON W. DUDAS
*Director of the United States Patent and Trademark Office*